(12) United States Patent
Hibino

(10) Patent No.: US 10,420,214 B2
(45) Date of Patent: Sep. 17, 2019

(54) PRINTED WIRING BOARD

(71) Applicant: IBIDEN CO., LTD., Ogaki (JP)

(72) Inventor: Toshiaki Hibino, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/935,297

(22) Filed: Mar. 26, 2018

(65) Prior Publication Data

US 2018/0279474 A1   Sep. 27, 2018

(30) Foreign Application Priority Data

Mar. 24, 2017 (JP) .................. 2017-058664

(51) Int. Cl.
*H05K 1/11* (2006.01)
*H05K 1/03* (2006.01)
(Continued)

(52) U.S. Cl.
CPC .......... *H05K 1/115* (2013.01); *H01L 23/5383* (2013.01); *H05K 1/0366* (2013.01); *H05K 1/0373* (2013.01); *H05K 3/0032* (2013.01); *H05K 3/0035* (2013.01); *H05K 3/421* (2013.01); *H05K 3/422* (2013.01); *H05K 3/423* (2013.01);
(Continued)

(58) Field of Classification Search
CPC .......... H05K 2201/09836; H05K 2201/09854; H05K 1/115; H05K 1/0251; H05K 2203/1572; H05K 2201/09709; H05K 2201/09509; H05K 2201/09563; H05K 2201/09827; H05K 1/0366; H05K 1/0373; H05K 2203/072; H05K 2203/0723; H05K 2203/107; H05K 3/0032; H05K 3/0035; H05K 3/421; H05K 3/423; H05K 3/428;
(Continued)

(56) References Cited

U.S. PATENT DOCUMENTS

2008/0257591 A1* 10/2008 Ikeda ............... H05K 1/119
174/255
2010/0065318 A1* 3/2010 Nagasawa ......... H01L 23/49827
174/260
(Continued)

FOREIGN PATENT DOCUMENTS

JP   2012-069926 A   4/2012

*Primary Examiner* — Chau N Nguyen
*Assistant Examiner* — Roshn K Varghese
(74) *Attorney, Agent, or Firm* — Oblon, McClelland, Maier & Neustadt, L.L.P.

(57) ABSTRACT

A printed wiring board includes a substrate having first and second surfaces such that the substrate has a thickness in a range of 30 μm to 100 μm between the first and second surfaces, and through hole conductors including plating material such that the through hole conductors are formed in through holes extending from the first surface to the second surface. Each through hole has a first opening portion and a second opening portion connected to the first opening portion such that the first opening portion has a tapered shape decreasing in diameter from the first surface toward the second surface, the second opening portion has a tapered shape decreasing in diameter from the second surface toward the first surface, and center lines of the first and second opening portions are shifted from each other by a distance that is equal to or less than the thickness of the substrate.

20 Claims, 3 Drawing Sheets

(51) Int. Cl.
*H05K 3/42* (2006.01)
*H05K 3/00* (2006.01)
*H01L 23/538* (2006.01)
*H05K 3/46* (2006.01)

(52) U.S. Cl.
CPC ............ *H05K 3/428* (2013.01); *H05K 3/429* (2013.01); *H05K 3/4602* (2013.01); *H05K 2201/09509* (2013.01); *H05K 2201/09563* (2013.01); *H05K 2201/09827* (2013.01); *H05K 2201/09854* (2013.01); *H05K 2203/072* (2013.01); *H05K 2203/0723* (2013.01); *H05K 2203/107* (2013.01); *H05K 2203/1572* (2013.01)

(58) Field of Classification Search
CPC ... H05K 3/429; H05K 3/4602; H01L 23/5383
See application file for complete search history.

(56) References Cited

U.S. PATENT DOCUMENTS

| | | | |
|---|---|---|---|
| 2012/0186866 A1* | 7/2012 | Mikado | H05K 1/185 174/260 |
| 2014/0209356 A1* | 7/2014 | Sakai | H05K 1/115 174/251 |

\* cited by examiner

PRINTED WIRING BOARD

CROSS-REFERENCE TO RELATED APPLICATIONS

The present application is based upon and claims the benefit of priority to Japanese Patent Application No. 2017-058664, filed Mar. 24, 2017, the entire contents of which are incorporated herein by reference.

BACKGROUND OF THE INVENTION

Field of the Invention

The present invention relates to a printed wiring board having through hole conductors formed by filling through holes with plating.

Description of Background Art

Japanese Patent Laid-Open Publication No. 2012-69926 describes a printed wiring board in which through hole conductors are formed by irradiating laser from both sides of a core substrate to form through holes each having a central constricted shape that decreases in diameter from both sides toward a center and by filling the through holes with plating.

SUMMARY OF THE INVENTION

According to one aspect of the present invention, a printed wiring board includes a substrate having a first surface and a second surface on the opposite side with respect to the first surface such that the substrate has a thickness in a range of 30 μm to 100 μm between the first surface and the second surface, and through hole conductors including plating material such that the through hole conductors are formed in through holes extending from the first surface to the second surface, respectively. Each of the through holes has a first opening portion and a second opening portion connected to the first opening portion such that the first opening portion has a tapered shape decreasing in diameter from the first surface toward the second surface of the substrate, that the second opening portion has a tapered shape decreasing in diameter from the second surface toward the first surface of the substrate, and that a center line of the first opening portion and a center line of the second opening portion are shifted from each other by a distance that is equal to or less than the thickness of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
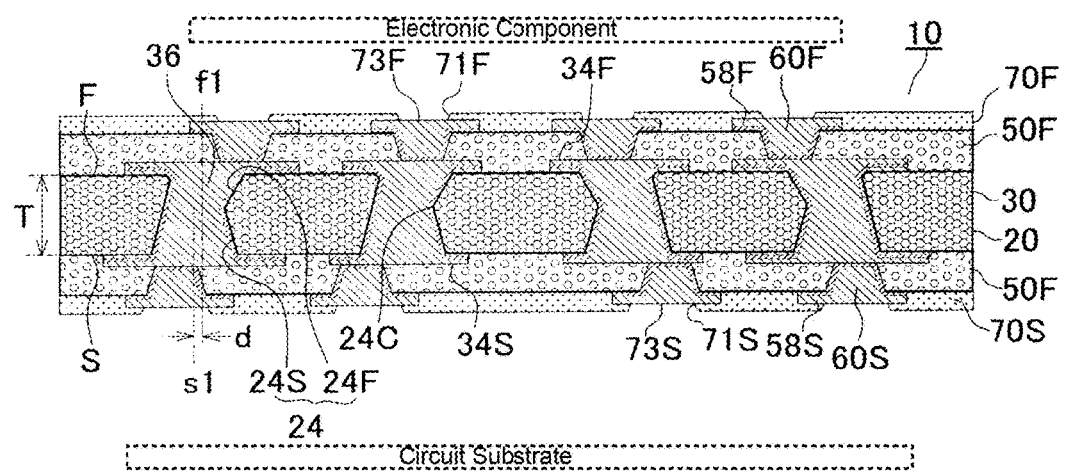
FIG. 1A is a cross-sectional view of a printed wiring board according to a first embodiment of the present invention.

Embodiments will now be described with reference to the accompanying drawings, wherein like reference numerals designate corresponding or identical elements throughout the various drawings.

First Embodiment

FIG. 1A is a cross-sectional view of a printed wiring board according to a first embodiment.

A printed wiring board 10 includes a core substrate 30 that has a first surface (F) and a second surface (S) on an opposite side with respect to the first surface. An insulating substrate 20 that forms the core substrate 30 is formed of a resin and a reinforcing material, the resin containing inorganic particles. In the core substrate 30, a first conductor layer (34F) is formed on the first surface (F) side, and a second conductor layer (34S) is formed on the second surface (S) side. The first conductor layer (34F) and the second conductor layer (34S) are connected to each other via through hole conductors 36 which are formed by filling through holes 24 formed in the core substrate 30 with plating. In the printed wiring board, a build-up layer is provided on each of the first surface (F) and the second surface (S) of the core substrate 30, That is, an upper side resin insulating layer (50F) is formed on the first surface (F) of the core substrate 30 and on the first conductor layer (34F). An upper side conductor layer (58F) is formed on the upper side resin insulating layer (50F). The first conductor layer (34F) and the upper side conductor layer (58F) are connected to each other via conductors (60F) penetrating the upper side resin insulating layer (50F). A solder resist layer (70F) having openings (71F) is formed on the upper side resin insulating layer (50F) and on the upper side conductor layer (58F). The upper side conductor layer (58F) exposed from the openings (71F) has upper side pads (73F) for mounting an electronic component such as an IC chip A lower side resin insulating layer (50S) is formed on the second surface (S) of the core substrate 30 and on the second conductor layer (34S). A lower side conductor layer (58S) is formed on the lower side resin insulating layer (50S). The second conductor layer (34S) and the lower side conductor layer (58S) are connected to each other via conductors (60S) penetrating the lower side resin insulating layer (50S). A solder resist layer (70S) having openings (71S) is formed on the lower side resin insulating layer (50S) and on the lower side conductor layer (58S). The lower side conductor layer (58S) exposed from the openings (71S) has lower side pads (73S) for connecting to a circuit substrate such as a motherboard. The upper side resin insulating layer (50F) and the lower side resin insulating layer (50S) do not each have a core material.

The through holes 24 of the core substrate 30 are each formed from a first opening (24F) and a second opening (24S), the first opening (24F) having a tapered shape that decreases in diameter from the first surface (F) side toward the second surface (S), and the second opening (24S) being connected to the first opening (24F) and having a tapered shape that decreases in diameter from the second surface (S) toward the first surface (F). In each of the through holes 24, a central constricted portion (24C) is formed at a joining place between the first opening (24F) and the second opening (24S). In the first embodiment, since the central constricted portion (24C) is formed at a substantially central portion of each of the through holes 24, a void is unlikely to remain in the central portion during plating, and thus, the through hole conductors 36 formed by filling the through holes 24 with plating are highly reliable.

A center line (f1) of the first opening (24F) and a center line (s1) of the second opening (24S) are shifted from each other by a distance (d) equal to or less than a thickness (T) of the insulating substrate 20 of the core substrate 30. The distance (d) is desirably ¹⁄₂₀ or more of the thickness (T) of the insulating substrate 20. Further, the distance (d) is particularly desirably ¹⁄₁₀ or more of the thickness (T) of the insulating substrate 20. The thickness (T) of the insulating substrate 20 is 100 μm or less and 30 μm or more. When the thickness exceeds 100 μm, the first opening (24F) and the second opening (24S) can each be formed to have a tapered shape by irradiating laser from both sides of the insulating substrate without shifting the center line (f1) of the first opening (24F) and the center line (s1) of the second opening (24S) from each other. On the other hand, when the thickness (T) of the insulating substrate 20 is less than 30 μm, even when the first opening (24F) and the second opening (24S) are formed by shifting the center line (f1) of the first opening (24F) and the center line (s1) of the second opening (24S) from each other and irradiating the laser from both sides, the through holes are formed each having a simple cylindrical shape without central constriction.

Manufacturing Method of First Embodiment

A method for manufacturing the printed wiring board 10 of the first embodiment is illustrated in FIGS. 2A-2F and 3A-3D.

Figure 2A:
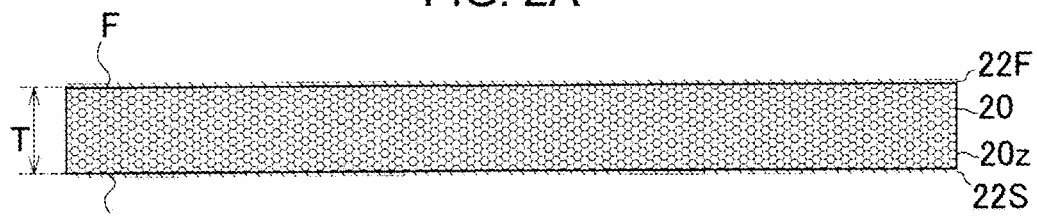
FIG. 2A-2F are manufacturing process diagrams of the printed wiring board of the first embodiment.

A starting substrate illustrated in FIG. 2A is prepared. The starting substrate (20z) is formed to include: an insulating substrate 20 having a first surface (F) and a second surface (S) on an opposite side with respect to the first surface; a first copper foil (22F) laminated on the first surface (F) of the insulating substrate 20; and a second copper foil (22S) laminated on the second surface (S) of the insulating substrate 20. The insulating substrate 20 has a thickness (T) of 100 μm or less and 30 μm or more. In this example, the thickness (T) is 80 μm. The insulating substrate 20 is formed of a resin and a reinforcing member. The insulating substrate 20 may contain inorganic particles. Examples of the resin of the insulating substrate 20 include an epoxy resin and a BT (bismaleimide triazine) resin. Examples of the reinforcing member of the insulating substrate 20 include a glass cloth and an aramid fiber. Examples of the inorganic particles of the insulating substrate 20 include silica particles and alumina particles.

Figure 2B:
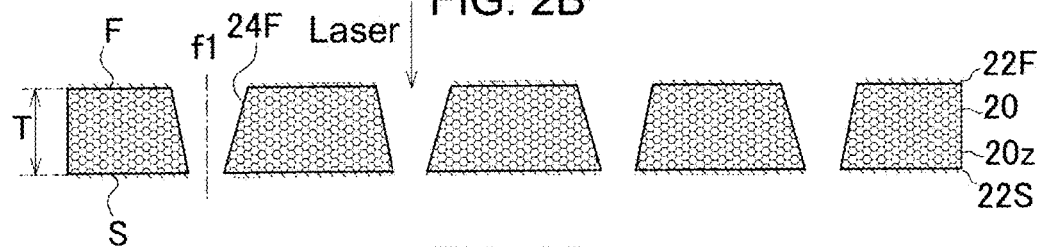

As illustrated in FIG. 2B, CO2 laser is irradiated to the first copper foil (22F). The first openings (24F) are formed on the first surface (F) side of the insulating substrate. The first openings (24F) are each tapered from the first surface toward the second surface (S). Conditions of the laser are set such that tapered shapes are formed. The conditions of the laser include the number of shots, a pulse width, output, and the like. A diameter of a second shot can be set to be smaller than a diameter of a first shot.

Figure 1C:
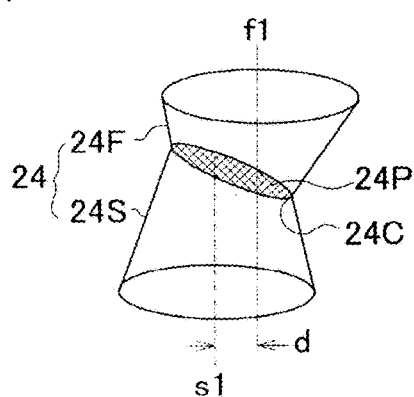
FIG. 1C is an explanatory diagram of a through hole.
Figure 2C:
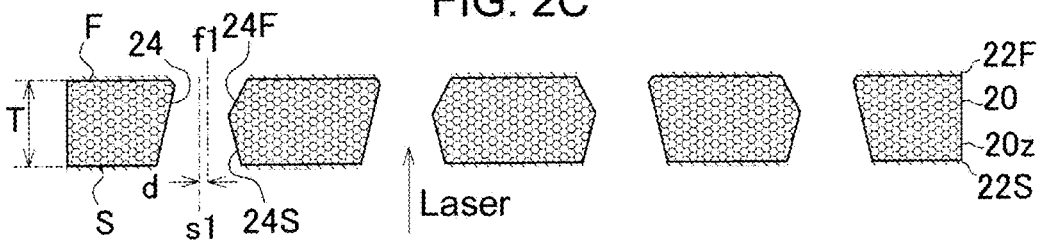

As illustrated in FIG. 2C, CO2 laser is irradiated to the second copper foil (22S). The second openings (24S) are formed on the second surface (S) side of the insulating substrate. The second openings (24S) are each tapered from the second surface (S) toward the first surface (F). Conditions of the laser are set such that tapered shapes are formed. The conditions of the laser include the number of shots, a pulse width, output, and the like. A diameter of a second shot can be set to be smaller than a diameter of a first shot. The through holes 24 are each formed from a first opening (24F) and a second opening (24S). A joining interface (24P) is formed at a joining place of the first opening and the second opening. The joining interface is illustrated in FIG. 1C. Oblique lines are drawn in the joining interface in FIG. 1C, and an outer periphery of the joining interface (24P) forms a central constricted portion (24C). The first opening (24F) is formed such that the center line (f1) is perpendicular to the insulating substrate 20. The second opening (24S) is formed such that the center line (s1) is perpendicular to the insulating substrate 20. Here, the first opening and the second opening are formed to be perpendicular to the insulating substrate 20. However, the first opening and the second opening may also be formed to be inclined with respect to the insulating substrate 20. When the first opening and the second opening are inclined, the distance (d) between the center line (f1) of the first opening (24F) and the center line (s1) of the second opening (24S) means a shortest distance between the two center lines.

Figure 2D:
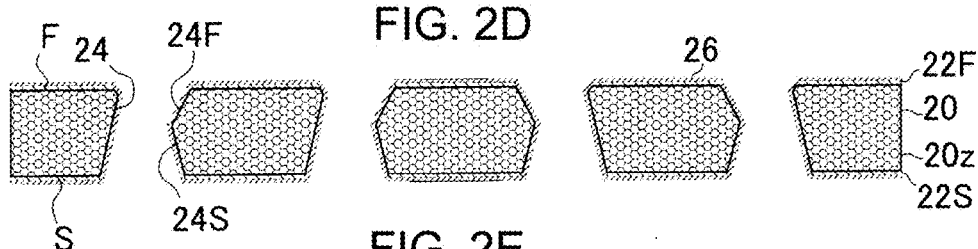
Figure 2E:
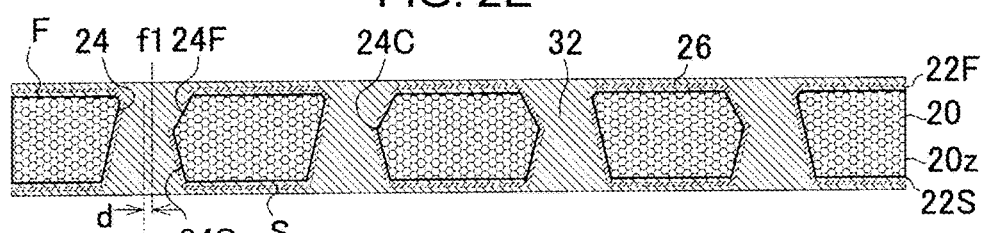
Figure 2F:
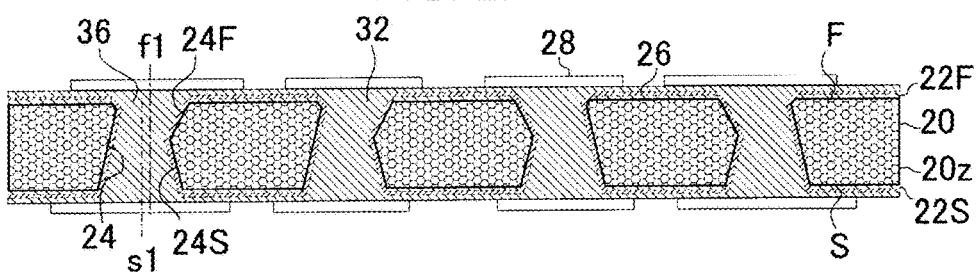
Figure 3A:
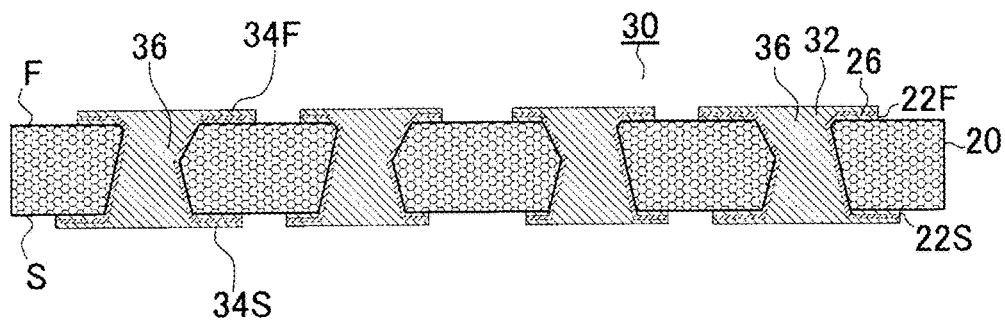
FIG. 3A-3D are manufacturing process diagrams of the printed wiring board of the first embodiment.

An electroless plating film 26 is formed by an electroless plating treatment on the first copper foil (22F), the second copper foil (22S), and side walls of the through holes 24 (FIG. 2D). Using the electroless plating film 26 as a seed layer, an electrolytic plating film 32 is formed on the seed layer (FIG. 2E). An etching resist 28 is formed on the electrolytic plating film (FIG. 2F). The electrolytic plating film 32 and the electroless plating film 26, and the copper foils (22F, 22S), which are exposed from the etching resist, are removed by etching. The etching resist is removed, and the core substrate 30 is completed (FIG. 3A). As illustrated in FIG. 3A, the through hole conductors 36 are formed in the through holes 24. At the same time, the first conductor layer (34F) and the second conductor layer (34S), each including lands of the through hole conductors, are formed. The center line (f1) of the first opening (24F) and the center line (S1) of the second opening (24S) are shifted from each other by the distance (d) equal to or less than the thickness (T) of the insulating substrate 20. Therefore, the central constricted portion (24C) is formed at the joining place between the first opening (24F) and the second opening (24S) of the insulating substrate 20 having a thickness of 100 μm or less. In the first embodiment, since the central constricted portion (24C) is formed at a substantially central portion of each of the through holes 24, a void is unlikely to remain in the central portion during plating, and thus, the through hole conductors 36 formed by filling the through holes 24 with plating are highly reliable. Further, a shape of a cross section passing through the center line (f1) of the first opening (24F) and the center line (s1) of the second opening (24S) of each of the through holes 24 is a K-shape.

Figure 3B:
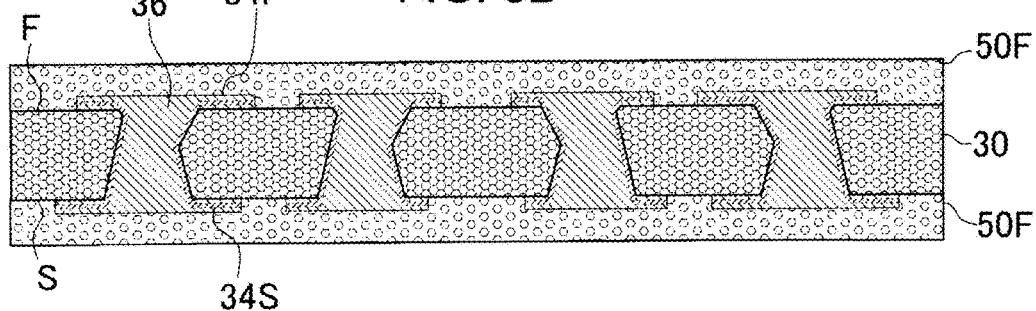
Figure 3C:
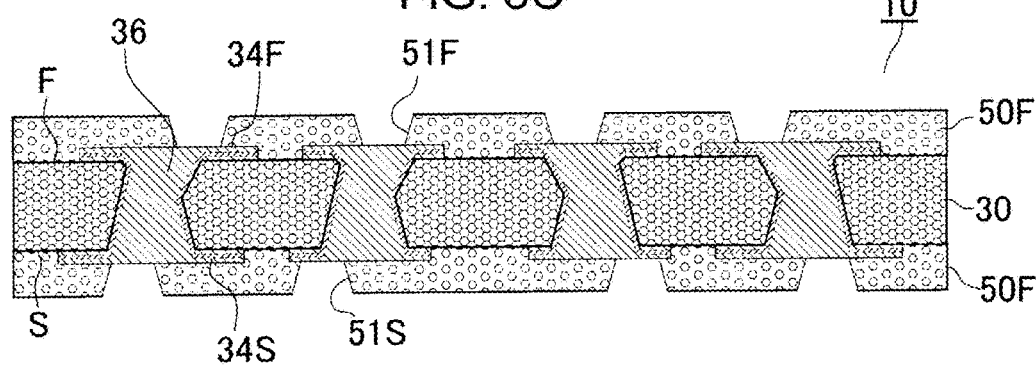

The upper side resin insulating layer (50F) is formed on the first surface (F) of the core substrate 30, and the lower side resin insulating layer (50S) is formed on the second surface (S) of the core substrate 30 (FIG. 3B). The upper side resin insulating layer (50F) and the lower side resin insulating layer (50S) are each formed of a resin that contains particles but does not contain a core material. Examples of the resin include an epoxy resin, a BT (bismaleimide triazine) resin, and the like. The particles include inorganic particles such as silica particles and thermosetting resin particles such as epoxy particles. By using CO2 laser, openings (51F) leading to the first conductor layer (34F) are formed in the upper side resin insulating layer (50F), and openings (51S) leading to the second conductor layer (34S) are formed in the lower side resin insulating layer (50S) (FIG. 3C).

Figure 3D:
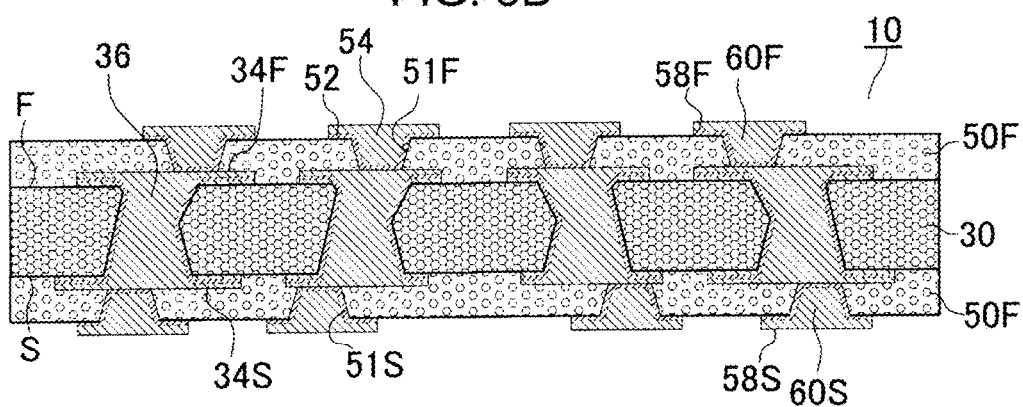

An electroless copper plating film 52 is formed on the upper side resin insulating layer (50F) and inner walls of the openings (51F), and on the lower side resin insulating layer (50S) and inner walls of the openings (51S), and a plating resist (not illustrated in the drawings) is formed on the electroless copper plating film 52. An electrolytic copper plating film 54 is formed on the electroless copper plating film 52 exposed from the plating resist. In this case, the openings (51F, 51S) are filled by the electrolytic copper plating film 54. The via conductors (60F) connecting to the first conductor layer (34F) are formed in the openings (51F), and the via conductors (60S) connecting to the second conductor layer (34S) are formed in the openings (51S). The plating resist is removed. The electroless copper plating film 52 in a non-forming portion of the electrolytic copper plating film 54 is removed, and the upper side conductor layer (58F) and the lower side conductor layer (58S) are formed (FIG. 3D).

The solder resist layer (70F) having the openings (71F) is formed on the upper side resin insulating layer (50F) and the upper side conductor layer (58F), and the solder resist layer (70S) having the openings (71S) is formed on the lower side resin insulating layer (50S) and the lower side conductor layer (58S), and the printed wiring board 10 is completed (FIG. 1A).

Second Embodiment

Figure 1B:
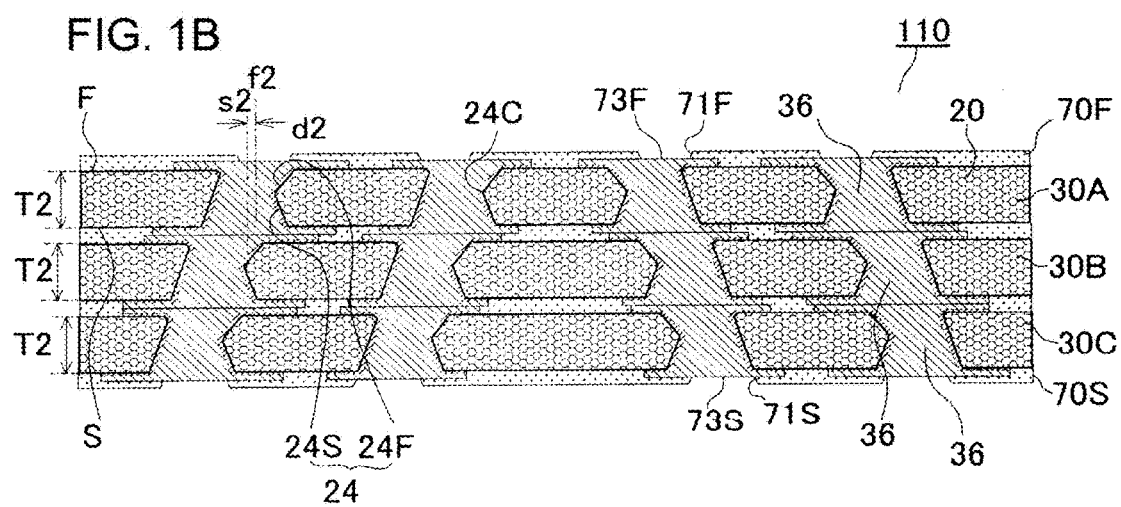
FIG. 1B is a cross-sectional view of a printed wiring board according to a second embodiment.

FIG. 1B is a cross-sectional view of a printed wiring board according to a second embodiment.

A printed wiring board 110 is formed by laminating core substrates (30A, 30B, 30C) having through hole conductors 36 each having a K-shaped cross section. Also in the printed wiring board of the second embodiment, the core substrates (30A, 30B, 30C) each have a thickness (T2) of 100 μm or less and 30 μm or more. In this example, the thickness (T2) is 60 μm. In each of through holes 24 of each of the core substrates, a center line (f2) of a first opening (24F) and a center line (s2) of a second opening (24S) are shifted from each other by a distance (d2) equal to or less than a thickness (T2) of an insulating substrate 20 of each of the core substrates 30. The through holes 24 of the insulating substrate 20 are each formed from a first opening (24F) and a second opening (24S), the first opening (24F) having a tapered shape that decreases in diameter from the first surface (F) side toward the second surface (S), and the second opening (24S) being connected to the first opening (24F) and having a tapered shape that decreases in diameter from the second surface (S) toward the first surface (F). In each of the through holes 24, a central constricted portion (24C) is formed at a joining place between the first opening (24F) and the second opening (24S). In the printed wiring board 110 of the second embodiment, since the central constricted portion (24C) is formed at a substantially central portion of each of the through holes 24, a void is unlikely to remain in the central portion during plating, and thus, the through hole conductors 36 formed by filling the through holes 24 with plating are highly reliable.

In Japanese Patent Laid-Open Publication No. 2012-69926, when the through hole conductors are formed by irradiating laser from both sides of the core substrate to form, in the core substrate, each of the through holes having a central constricted shape that decreases in diameter from both sides toward a center and by filling the through holes with plating, voids are unlikely to remain in the central constricted portions of the through holes. However, when the core substrate is formed to have a thickness of 100 μm or less and reduces the thickness of the printed circuit board, even when laser is irradiated from both sides, each of the through holes is formed to have a simple cylindrical shape without central constriction. Therefore, voids are likely to remain in central portions of the through holes.

A printed wiring board according to an embodiment of the present invention includes through hole conductors formed by filling through holes with plating, the through holes being formed in a substrate having a first surface and a second surface on an opposite side with respect to the first surface. The substrate has a thickness of 30 μm or more and 100 μm or less. The through holes each have a first opening and a second opening, the first opening having a tapered shape that decreases in diameter from the first surface side toward the second surface, and the second opening being connected to the first opening and having a tapered shape that decreases in diameter from the second surface side toward the first surface. A center line of the first opening and a center line of the second opening are shifted from each other by a distance equal to or less than the thickness of the substrate.

According to an embodiment of the present invention, for the first opening extending from the first surface toward the second surface and the second opening extending from the second surface side toward the first surface, of each of the through holes for the through hole conductors, the center line of the first opening and the center line of the second opening are shifted from each other by a distance equal to or less than the thickness of the substrate. Therefore, even when the thickness of the substrate is 100 μm or less, the first opening can be formed to have a tapered shape that decreases in diameter from the first surface side toward the second surface, the second opening can be formed to have a tapered shape that decreases in diameter from the second surface side toward the first surface, and a constricted portion can be formed in the center. Therefore, when the through holes each having the first opening and the second opening are filled with plating, voids are unlikely to remain in the central portions, and the through hole conductors are highly reliable.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising: a substrate having a first surface and a second surface on an opposite side with respect to the first surface such that the substrate has a thickness in a range of 30 μm to 100 μm between the first surface and the second surface; and a plurality of through hole conductors comprising plating material such that the plurality of through hole conductors is formed in a plurality of through holes extending from the first surface to the second surface, respectively, wherein each of the through holes has a first opening portion and a second opening portion connected to the first opening portion such that the first opening portion has a tapered shape decreasing in diameter from the first surface toward the second surface of the substrate, that the second opening portion has a tapered shape decreasing in diameter from the second surface toward the first surface of the substrate, and that a center line of the first opening portion and a center line of the second opening portion are shifted from each other by a distance that is equal to or less than the thickness of the substrate to form a central constricted portion and a cross section from the first surface to the second surface of the substrate in a K-shape having a straight side wall line across the thickness of the substrate and a bent side wall line across the thickness of the substrate, and the bent side wall line is bent at the central constricted portion toward the straight side wall line in the cross section and formed of only a first straight line portion of the first opening portion and a second straight line portion of the second opening portion connected to the first straight line portion at the central constricted portion where the cross section passes through the center lines of the first and second opening portions.

2. A printed wiring board according to claim 1, wherein each of the through hole conductors comprises the plating material comprising electrolytic plating material.

3. A printed wiring board according to claim 2, further comprising:
a first build-up layer formed on the first surface of the substrate; and
a second build-up layer formed on the second surface of the substrate.

4. A printed wiring board according to claim 2, wherein the substrate is formed in a plurality such that the plurality of substrates forms a laminated substrate structure.

5. A printed wiring board according to claim 2, wherein the substrate comprises resin material and reinforcing material.

6. A printed wiring board according to claim 1, further comprising:
a first build-up layer formed on the first surface of the substrate; and
a second build-up layer formed on the second surface of the substrate.

7. A printed wiring board according to claim 6, wherein the first build-up layer comprises an insulating layer and a conductor layer, and the second build-up layer comprises an insulating layer and a conductor layer.

8. A printed wiring board according to claim 6, wherein the substrate comprises resin material and reinforcing material.

9. A printed wiring board according to claim 1. wherein the substrate is formed in a plurality such that the plurality of substrates forms a laminated substrate structure.

10. A printed wiring board according to claim 9, wherein each of the substrates comprises resin material and reinforcing material.

11. A printed wiring board according to claim 1, wherein the substrate is formed such that the center lines of the first and second opening portions are shifted from each other by the distance that is 1/20 of the thickness of the substrate or greater.

12. A printed wiring board according to claim 1, wherein the substrate is formed such that the center lines of the first and second opening portions are shifted from each other by the distance that is 1/10 of the thickness of the substrate or greater.

13. A printed wiring board according to claim 1, wherein the substrate comprises resin material and reinforcing material.

14. A printed wiring board according to claim 6, wherein the substrate comprises resin material and reinforcing material, the first build-up layer comprises a resin insulating layer and a conductor layer, and the second build-up layer comprises a resin insulating layer and a conductor layer.

15. A printed wiring board according to claim 6, wherein the substrate comprises resin material and reinforcing material, the first build-up layer comprises a resin insulating layer including inorganic particles, and the second build-up layer comprises a resin insulating layer including inorganic particles.

16. A printed wiring board according to claim 1, further comprising:
a first build-up layer formed on the first surface of the substrate and comprising a plurality of first pads such that the plurality of first pads is positioned to mount an electronic component on a surface of the first build-up layer; and
a second build-up layer formed on the second surface of the substrate and comprising a plurality of second pads such that the plurality of second pads is positioned to mount a circuit substrate on a surface of the second build-up layer.

17. A printed wiring board according to claim 1, wherein the substrate is formed in a plurality such that the plurality of substrates forms a laminated substrate structure and includes a first substrate comprising a plurality of first pads positioned to mount an electronic component on a surface of the first substrate, and a second substrate comprising a plurality of second pads positioned to mount a circuit substrate on a surface of the second substrate.

18. A printed wiring board according to claim 1, wherein the substrate comprises resin material, reinforcing material and inorganic particles.

19. A method for manufacturing a printed wiring board, comprising: providing a substrate having a first surface and a second surface on an opposite side with respect to the first surface such that the substrate has a thickness in a range of 30 μm to 100 μm between the first surface and the second surface; forming a plurality of through hole through the substrate such that the plurality of through holes extends from the first surface to the second surface and that each of the through holes has a first opening portion and a second opening portion connected to the first opening portion; and filling plating material into the plurality of through holes such that a plurality of through hole conductors comprising the plating material is formed in the plurality of through holes extending from the first surface to the second surface, respectively, wherein the forming of the plurality of through holes comprises forming the first opening portion having a tapered shape decreasing in diameter from the first surface toward the second surface of the substrate, and forming the second opening portion having a tapered shape decreasing in diameter from the second surface toward the first surface of the substrate such that a center line of the first opening portion and a center line of the second opening portion are shifted from each other by a distance that is equal to or less than the thickness of the substrate to form a central constricted portion and a cross section from the first surface to the second surface of the substrate in a K-shape having a straight side wall line across the thickness of the substrate and a bent side wall line across the thickness of the substrate, and the bent side wall line is bent at the central constricted portion toward the straight side wall line in the cross section and formed of only a first straight line portion of the first opening portion and a second straight line portion of the second opening portion connected to the first straight line portion at the central constricted portion where the cross section passes through the center lines of the first and second opening portions.

20. A method for manufacturing a printed wiring board according to claim 19, wherein each of the through hole conductors comprises the plating material comprising electrolytic plating material.

* * * * *